(12) United States Patent
Liu

(10) Patent No.: US 10,311,256 B2
(45) Date of Patent: Jun. 4, 2019

(54) ID READER AND MONITORING EQUIPMENT

(71) Applicants: BOE TECHNOLOGY GROUP CO., LTD., Beijing (CN); BEIJING BOE DISPLAY TECHNOLOGY CO., LTD., Beijing (CN)

(72) Inventor: Chunyuan Liu, Beijing (CN)

(73) Assignees: BOE TECHNOLOGY GROUP CO., LTD., Beijing (CN); BEIJING BOE DISPLAY TECHNOLOGY CO., LTD., Beijing (CN)

( * ) Notice: Subject to any disclaimer, the term of this patent is extended or adjusted under 35 U.S.C. 154(b) by 197 days.

(21) Appl. No.: 15/504,495

(22) PCT Filed: Jul. 26, 2016

(86) PCT No.: PCT/CN2016/091724
§ 371 (c)(1),
(2) Date: Feb. 16, 2017

(87) PCT Pub. No.: WO2017/117977
PCT Pub. Date: Jul. 13, 2017

(65) Prior Publication Data
US 2018/0060614 A1    Mar. 1, 2018

(30) Foreign Application Priority Data
Jan. 5, 2016   (CN) .......................... 2016 1 0007007

(51) Int. Cl.
*H05K 7/02* (2006.01)
*H05K 7/04* (2006.01)
(Continued)

(52) U.S. Cl.
CPC .............. *G06K 7/01* (2013.01); *F16M 11/12* (2013.01); *G02F 1/1333* (2013.01);
(Continued)

(58) Field of Classification Search
CPC ...... G06K 7/01; G06K 7/10881; F16M 11/12; G02F 1/1333; H05K 5/0217
(Continued)

(56) References Cited

U.S. PATENT DOCUMENTS 5,479,017 A    12/1995  Yamada et al.
6,045,103 A *  4/2000   Costa ..................... F16M 11/10
                                                   211/119.06
(Continued)

FOREIGN PATENT DOCUMENTS

CN         1758700 A      4/2006
CN       201305360 Y      9/2009
(Continued)

OTHER PUBLICATIONS

The First Chinese Office Action dated Apr. 3, 2018; Appln. No. 201610007007.5
(Continued)

*Primary Examiner* — Hung S. Bui
(74) *Attorney, Agent, or Firm* — Ladas & Parry LLP

(57) ABSTRACT

An ID reader, comprising: a base (1); a connecting frame (4) that is rotatably connected with the base (1) and rotates around a first axial line; and a reader body (3) that is rotatably connected with the connecting frame (4) and rotates around a second axial line. The ID reader is facilitated to provide convenience for angle adjustment during acquirement of IDs, improving applicability of the reader. A monitoring equipment is also provided.

18 Claims, 2 Drawing Sheets

(51) Int. Cl.
*G06K 7/01* (2006.01)
*G02F 1/1333* (2006.01)
*F16M 11/12* (2006.01)
*H05K 5/02* (2006.01)
*G06K 7/10* (2006.01)

(52) U.S. Cl.
CPC ....... *G06K 7/10881* (2013.01); *H05K 5/0217* (2013.01); *F16M 2200/021* (2013.01)

(58) Field of Classification Search
USPC .......................................................... 361/807
See application file for complete search history.

(56) References Cited

U.S. PATENT DOCUMENTS

| | | | | |
|---|---|---|---|---|
| 6,963,316 B1 * | 11/2005 | Lin | ...................... | H01Q 1/1228 343/882 |
| 7,113,144 B2 * | 9/2006 | Lin | ........................ | H01Q 1/125 343/880 |
| 7,954,777 B2 * | 6/2011 | Bohm | .................... | F16M 11/10 248/274.1 |
| 9,201,291 B2 * | 12/2015 | Jorgenson | ............ | G03B 17/561 |
| 2002/0084396 A1 * | 7/2002 | Weaver | .................. | F16M 11/10 248/278.1 |

FOREIGN PATENT DOCUMENTS

| | | |
|---|---|---|
| CN | 201837815 U | 5/2011 |
| CN | 202349541 U | 7/2012 |
| CN | 203142412 U | 8/2013 |
| CN | 203745720 U | 7/2014 |
| CN | 104074681 A | 10/2014 |
| CN | 203948905 U | 11/2014 |
| CN | 204256240 U | 4/2015 |
| CN | 204592798 U | 8/2015 |
| CN | 204756327 U | 11/2015 |
| CN | 204840799 U | 12/2015 |
| CN | 105676504 A | 6/2016 |

OTHER PUBLICATIONS

International Search Report and Written Opinion dated Oct. 26, 2016; PCT/CN2016/091724.

* cited by examiner

ID READER AND MONITORING EQUIPMENT

TECHNICAL FIELD

Embodiments of the present disclosure relate to an ID reader and a monitoring equipment.

BACKGROUND

In the manufacturing process of TFT-LCDs, computerized accounting operates to track the technical process of panels, prevent loss and facilitate management. Once something fails in the computerized accounting, the following tracking and handling will face a lot of unnecessary troubles. However, in practical manufacturing processes, since the attachment position of Panel IDs often varies, it is often needed to adjust the angle of the reader based on a barcode scanning identification software to adapt to the variation. However, since the angle of the reader is generally fixed, the position and angle of the base table will have to be adjusted to aim the scanning head of the reader every time the attachment position of Panel IDs changes.

At present, since the reader is mounted in an inflexible way, it is uneasy to change the angle of the reader up and down and it is unfeasible to change the angle of the reader left and right; as a result the scanning head of the reader can only be aimed by adjusting the angle of the base table, leading to multiple times of adjustment and long time of operation if adjustment is required and thus affecting the manufacturing efficiency.

SUMMARY

According to at least one embodiment of this disclosure, an ID reader is provided, comprising: a base; a connecting frame that is rotatably connected with the base and rotates around a first axial line; and a reader body that is rotatably connected with the connecting frame and rotates around a second axial line.

For example, wherein the connecting frame and the base can be locked to a first set position when they are rotatably connected.

For example, the reader body and the connecting frame may be locked to a second set position when they are rotatably connected.

For example, the ID reader is a panel ID reader.

For example, the base and the connecting frame are rotatably connected by a first rotating shaft whose axial line is the first axial line.

For example, the base has a first arc rail disposed thereon and the first arc rail has its center disposed on the base where the first rotating shaft is located.

For example, the first arc rail has a first locking piece disposed therein and the connecting frame is locked to the first set position by the first locking piece.

For example, the first locking piece is disposed to penetrate through the first arc rail and connect with the connecting frame through threaded coupling.

For example, there are two first arc rails, and they are disposed symmetrically on both sides of the first rotating shaft.

For example, the first rotating shaft is a bolt or screw.

For example, the base has a plain hole disposed therein, and the bolt or screw penetrates through the plain hole and connects with the connecting frame through threaded coupling.

For example, the connecting frame and the reader body are rotatably connected by a second rotating shaft whose axial line is the second axial line.

For example, the connecting frame has a second arc rail disposed thereon and the second arc rail has its center disposed on the connecting frame where the second rotating shaft is located.

For example, the second arc rail also has a second locking piece disposed therein and the reader body is locked to a second set position by the second locking piece.

For example, the second locking piece is disposed to penetrate through the second arc rail and connect with the reader body through threaded coupling.

For example, wherein the second rotating shaft is a bolt or screw.

For example, the connecting frame has a plain hole disposed therein and the bolt or screw penetrates through the plain hole and connects with the reader body through threaded coupling.

For example, the first axial line and the second axial line form a set angle therebetween.

For example, the first axial line is spatially perpendicular to the second axial line.

According to at least one embodiment of this disclosure, a monitoring equipment comprising the ID reader is provided further.

REFERENCE NUMERALS

1—base,
2—first locking piece,
3—reader body
4—connecting frame,
5—second locking piece,
6—second arc rail
7—second rotating shaft,
8—first rotating shaft,
9—first arc rail

DETAILED DESCRIPTION

For convenience of reader adjustment, an embodiment of the present disclosure provides an ID reader and a monitoring equipment, for example, a panel ID reader. Of course, the ID reader of the present disclosure may also read IDs of other equipments. The ID reader and the monitoring equipment including the ID reader in the present disclosure will be illustrated only in the case of those for panels.

In the technical solution provided in the embodiment of the present disclosure, the reader body is connected rotatably with the support frame and the base to provide convenience for adjustment of reader angle and for the reader to acquire IDs of different panels, improving the adaptability of the monitoring equipment. In order to facilitate comprehension of the technical solution in the present disclosure, the technical solution will be explained in details in connection with accompanying figures and specific embodiments.

Figure 1:
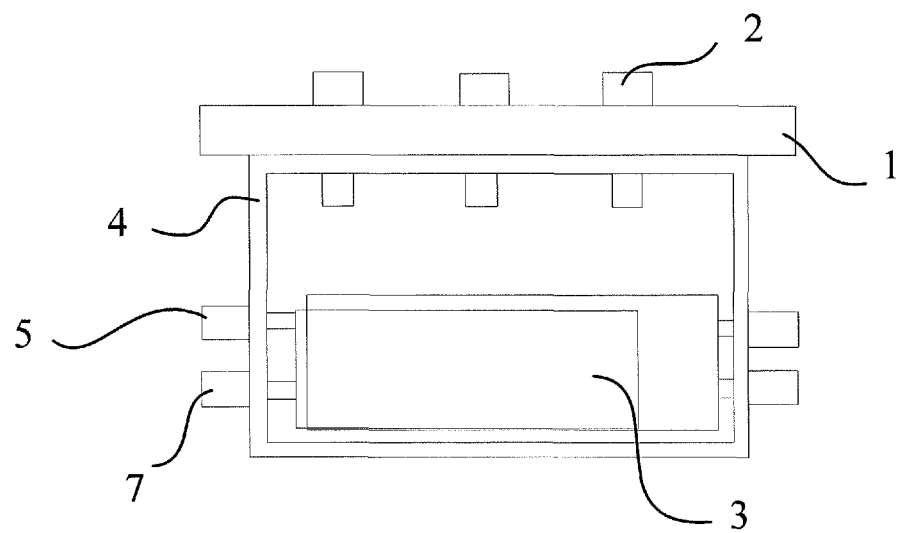
FIG. 1 is a structure diagram of a Panel ID reader provided in an embodiment of the present disclosure.

FIG. 1 shows a structure diagram of the panel ID reader provided in an embodiment of the present disclosure.

The embodiment of the present disclosure provides a panel ID reader including a base 1, a connecting frame 4 and a reader body 3. The connecting frame 4 is connected rotatably with the base 1. For example, the connecting frame 4 rotates around a first axial line so that it is rotatably connected with the base. The reader body 3 is connected rotatably with the connecting frame 4. For example, the reader body 3 rotates around a second axial line so that it is rotatably connected with the connecting frame 4. According to an example of the present disclosure, both the connecting frame 4 and the reader body 3 may be locked to a set position. Furthermore, the first and second axial lines may form a set angle therebetween.

In the embodiment described above, the reader is borne by the base 1 and the connecting frame 4; the base 1 and the connecting frame 4 are connected with each other in a rotatable way, and so do the connecting frame 4 and the reader body 3, so that the angle adjustment of the reader body 3 is facilitated to provide convenience for angle adjustment during acquirement of IDs of panels with different sizes, improving applicability of the reader.

In order to facilitate comprehension of the structure and operating principle of the reader provided in the embodiment of the present disclosure, detailed description thereof will be provided in connection with the specific FIGS. 1, 2 and 3 in the following.

Figure 2:
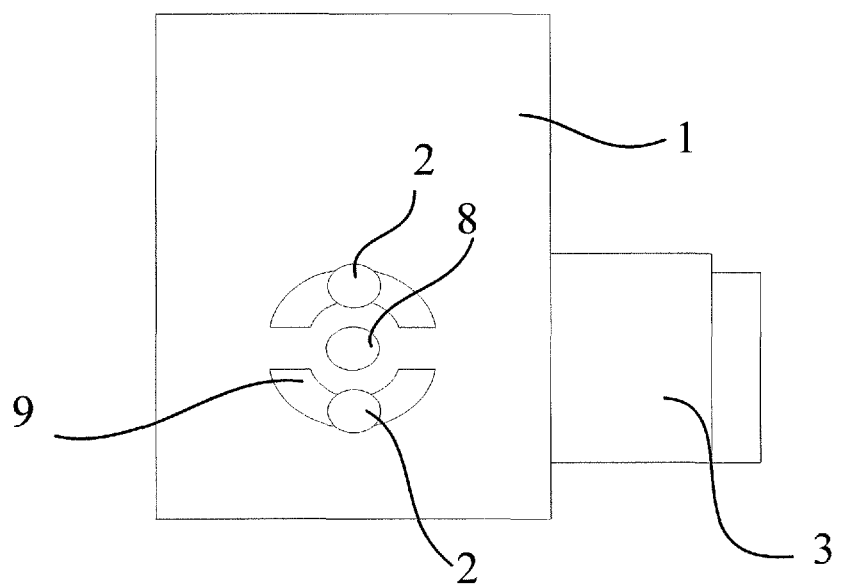
FIG. 2 is a top view of a Panel ID reader provided in an embodiment of the present disclosure.
Figure 3:
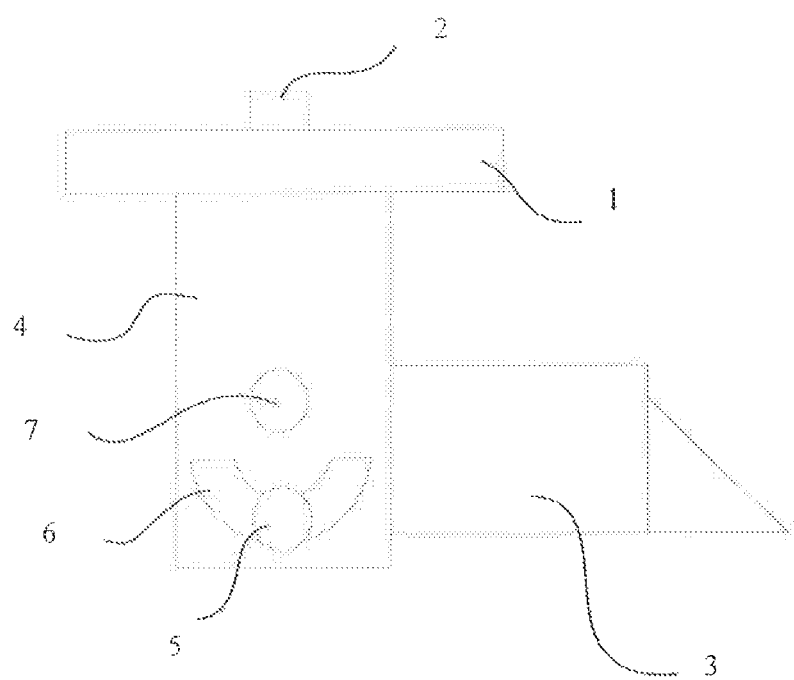
FIG. 3 is a side view of a Panel ID reader provided in an embodiment of the present disclosure.

FIG. 1 shows the front view of the reader, FIG. 2 shows the top view of the reader and FIG. 3 shows the side view of the reader.

As shown in FIG. 1, the reader provided in the present embodiment includes a base 1, a connecting frame 4 and a reader body 3, which can rotate with respect to each other. The reader body 3 may be a reading device used to read ID tags. For example, the reading device may be a bar code scanner, a two-dimensional code scanner, a RF reading equipment, a near field communicating device or the like. The ID tag may be a two-dimensional code, a bar code, an electronic tag or the like.

First of all, as shown in FIG. 1 and FIG. 2, with the direction in which the the reader is located as shown in FIG. 1 being taken as the reference direction, in the present embodiment, the connecting frame 4 is disposed under the base 1 and has a structure of a rectangular box, and then the reader body 3 is disposed in the rectangular box of the connecting frame 4.

When particular connection is performed, the base 1 and the connecting frame 4 are rotatably connected through a first rotating shaft 8 whose axial line is the above-mentioned first axial line, and the base 1 has an arc rail 9 disposed thereon and a first locking piece 2 disposed to penetrate through the first arc rail 9 and connect with the connecting frame 4 through threaded coupling. For example, the first arc rail 9 has its center disposed at the location on the base 1 where the first rotating shaft 8 is located. That is, as shown in FIG. 1 and FIG. 2, the base 1 and the connecting frame 4 are rotatably connected through the first rotating shaft 8, so that it is realized that the connecting frame drives the reader body 3 to rotate around the first axial line. In some embodiments, the first axial line may be a vertical axial line, so that the reader body 3 disposed on the connecting frame 4 may be allowed to rotate in a horizontal plane, i.e., the acquiring angle may be adjusted horizontally.

According to an example of present invention, the first rotating shaft 8 uses a bolt or screw that penetrates through a plain hole disposed in the base 1 to connect with the connecting frame 4 through threaded coupling. That is, in assembling, since the connecting frame 4 has a threaded hole disposed therein and the base 1 has a plain hole disposed therein to correspond to the threaded hole, the cap of the bolt or screw is left outside the plain hole and the threaded rod of the bolt or screw connects with the threaded hole through threaded coupling after penetrating through the plain hole, so that the base 1 and the connecting frame 4 are rotatably connected through the first rotating shaft 8 and the connecting frame 4 has its weight borne by the bolt or screw when rotating.

Furthermore, the base 1 and the connecting frame 4 may be locked when they are rotated with respect to each other to a position, so that the reader body 3 can stably acquire the ID number of the panel in this angle. For example, the base 1 has a first arc rail disposed thereon and a first locking piece 2 disposed to penetrate through the first arc rail 9 and connect with the connecting frame 4 through threaded coupling. For example, the first arc rail 9 has its center disposed at the location on the base 1 where the first rotating shaft 8 is located. When in locking, the first locking piece 2 is disposed in the first arc rail 9. When the connecting frame 4 is rotated with respect to the base 1, the first locking piece 2 may slide along the first arc rail 9, since the center of the first arc rail 9 is disposed on the base 1 where the first rotating shaft 8 is located. When the connecting frame 4 is rotated to a set angle, it is locked to the position through by first locking piece 2 to ensure the stability of the reader body 3 during information acquirement.

For example, there are two first arc rails 9 and they are disposed symmetrically on both sides of the rotating shaft 8, so that it can be ensured that the base 1 and the connecting frame 4 are locked with respect to each other. The first locking piece 2 may use a bolt or screw. When a bolt or screw is used, it is unscrewed to allow the connecting frame 4 to rotate around the first rotating shaft 8 if the connecting frame 4 is required to rotate, and screwed down to lock the connecting frame 4 when the connecting frame 4 is rotated to the desired position. When in the locking state, the stability of the base 1 and the connecting frame 4 with respect to each other may be improved by the first locking piece 2.

As shown in FIG. 1 and FIG. 3, the connecting frame 4 and the reader body 3 are connected in a way similar to how the base 1 and the connecting frame 4 are connected. For example, the reader body 3 rotates around a second axial line. The second axial line and the first axial line may form a set angle therebetween, allowing the reader body to be adapted to different directions. In the structure shown in FIG. 1, the reader body 3 may be adjusted through rotation in the vertical direction.

For example, the connecting frame 4 and the reader body 3 are connected through the second rotating shaft 7 whose axial line is the above-mentioned second axial line. The connecting frame 4 has a second arc rail 6 disposed thereon and a second locking piece 5 disposed to penetrate through the second arc rail 6 and connect with the reader body 3 through threaded coupling. Wherein, the second arc rail 6 has its center disposed on the connecting frame 4 where the second rotating shaft 7 is located.

The second rotating shaft 7 may use a bolt or screw. The connecting frame 4 may have a plain hole disposed therein, and the bolt or screw penetrates through the plain hole and connects with the reader body 3 through threaded coupling. That is, in assembling, since the reader body 3 has a threaded hole disposed therein and the connecting frame 4 has a plain hole disposed therein that corresponds to the threaded hole, the cap of the bolt or screw is left outside the plain hole while the threaded rod of the bolt or screw penetrates through the plain hole and connects with the threaded hole through threaded coupling, so that the connecting frame 4 and the reader body 3 are rotatably connected by the second rotating shaft 7.

According to an example of the present invention, the first axial line is spatially perpendicular to the second axial line, so that the connecting frame 4 is allowed to rotate horizontally and the reader is allowed to rotate vertically. Therefore the angle of the reader can be generally adjusted both horizontally and vertically. When the reader acquires IDs of panels with different sizes, the angle of the reader can be adjusted conveniently to adapt the reader to acquire the IDs of the panels with different sizes.

It should be appreciated that what the above-mentioned FIG. 1 and FIG. 2 show is only a specific embodiment of the present disclosure, in the reader for panel ID provided in embodiments of the present disclosure, the angle of the reader body may also be adjusted using other approaches, in which, for example, the first axial line is in the horizontal direction while the second axial line is in the vertical direction, or the first axial line forms an angle with respect to the vertical direction while the second axial line forms an angle with respect to the horizontal direction. Furthermore, the first and second axial lines may form an angle therebetween, which, for example, may be an acute angle or an obtuse angle, so that the angle of the reader body is enabled to be adjusted to ensure that the reader body may acquire IDs of panels with different sizes.

Embodiments of the present disclosure further provide a monitoring equipment including the ID reader in the embodiment described above. For brevity of the present specification, no further details will be repeated here.

In the embodiment described above, the reader is borne by the base 1 and the connecting frame 4; in the bearing, the base 1 and the connecting frame 4 are connected with each other in a rotatable way, and so do the connecting frame 4 and the reader body 3, so that the angle adjustment of the reader body 3 is facilitated to provide convenience for angle adjustment, further provide convenience for angle adjustment during acquisition of IDs of panels with different sizes, improving applicability of the reader.

Apparently, those skilled in the art can modify and change the present disclosure in various ways without departing from the spirit and scope of the present disclosure. Thus, if these modifications and changes of the present disclosure belong to the scope of claims and equivalents of the present disclosure, the present disclosure is intended to include them.

The present application claims priority of China patent application No. 201610007007.5 filed on Jan. 5, 2016, which is incorporated herein in its entirety by reference.

What is claimed is:

1. An ID reader, comprising:
a base;
a connecting frame that is rotatably connected with the base and rotates around a first axial line; and
a reader body that is rotatably connected with the connecting frame and rotates around a second axial line;
wherein the connecting frame and the reader body are rotatably connected by a second rotating shaft whose axial line is the second axial line;
wherein the connecting frame has a second arc rail disposed thereon and the second arc rail has its center disposed on the connecting frame where the second rotating shaft is located.

2. The ID reader of claim 1, wherein the connecting frame and the base can be locked to a first set position when they are rotatably connected.

3. The ID reader of claim 1, wherein the reader body and the connecting frame may be locked to a second set position when they are rotatably connected.

4. The ID reader of claim 1, wherein the ID reader is a panel ID reader.

5. The ID reader of claim 1, wherein the base and the connecting frame are rotatably connected by a first rotating shaft whose axial line is the first axial line.

6. The ID reader of claim 5, wherein the base has a first arc rail disposed thereon and the first arc rail has its center disposed on the base where the first rotating shaft is located.

7. The ID reader of claim 6, wherein the first arc rail has a first locking piece disposed therein and the connecting frame is locked to the first set position by the first locking piece.

8. The ID reader of claim 7, wherein the first locking piece is disposed to penetrate through the first arc rail and connect with the connecting frame through threaded coupling.

9. The ID reader of claim 6, wherein there are two first arc rails, and they are disposed symmetrically on both sides of the first rotating shaft.

10. The ID reader of claim 5, wherein the first rotating shaft is a bolt or screw.

11. The ID reader of claim 10, wherein the base has a plain hole disposed therein, and the bolt or screw penetrates through the plain hole and connects with the connecting frame through threaded coupling.

12. The ID reader of claim 1, wherein the second arc rail also has a second locking piece disposed therein and the reader body is locked to a second set position by the second locking piece.

13. The ID reader of claim 12, wherein the second locking piece is disposed to penetrate through the second arc rail and connect with the reader body through threaded coupling.

14. The ID reader of claim 1, wherein the second rotating shaft is a bolt or screw.

15. The ID reader of claim 14, wherein the connecting frame has a plain hole disposed therein and the bolt or screw penetrates through the plain hole and connects with the reader body through threaded coupling.

16. The ID reader of claim 1, wherein the first axial line and the second axial line form a set angle therebetween.

17. The ID reader of claim 16, wherein the first axial line is spatially perpendicular to the second axial line.

18. A monitoring equipment comprising the ID reader of claim 1.

* * * * *